United States Patent [19]
Manley

[11] Patent Number: 5,855,745
[45] Date of Patent: Jan. 5, 1999

[54] PLASMA PROCESSING SYSTEM UTILIZING COMBINED ANODE/ ION SOURCE

[75] Inventor: Barry W. Manley, Boulder, Colo.

[73] Assignee: Sierra Applied Sciences, Inc., Boulder, Colo.

[21] Appl. No.: 842,480

[22] Filed: Apr. 23, 1997

[51] Int. Cl.⁶ .................................................. C23C 14/34
[52] U.S. Cl. ............................ 204/192.12; 204/298.06; 204/298.07; 204/298.08; 204/298.09; 204/298.11; 204/298.12; 204/298.14; 204/298.16; 204/298.17; 204/298.18; 204/298.19
[58] Field of Search ........................ 204/298.06, 298.07, 204/298.08, 298.09, 298.11, 298.12, 298.14, 298.16, 298.17, 298.18, 298.19, 192.12, 192.1

[56] References Cited

U.S. PATENT DOCUMENTS

| | | | |
|---|---|---|---|
| 3,952,228 | 4/1976 | Reader et al. | 315/111.81 |
| 3,956,666 | 5/1976 | Reader et al. | 315/111.81 |
| 3,969,646 | 7/1976 | Reader et al. | 313/359.1 |
| 4,259,145 | 3/1981 | Harper et al. | 438/712 |
| 4,416,755 | 11/1983 | Ceasar et al. | 204/192.11 |
| 4,446,403 | 5/1984 | Cuomo et al. | 315/111.81 |
| 4,457,825 | 7/1984 | Lamont, Jr. | 204/298.12 |
| 4,481,062 | 11/1984 | Kaufman et al. | 156/345 |
| 4,523,971 | 6/1985 | Cuomo et al. | 156/345 |
| 4,541,890 | 9/1985 | Cuomo et al. | 156/345 |
| 4,588,490 | 5/1986 | Cuomo et al. | 204/298.06 |
| 4,610,770 | 9/1986 | Saito et al. | 204/192.1 |
| 4,739,170 | 4/1988 | Varga | 250/427 |
| 4,761,218 | 8/1988 | Boys | 204/298.19 |
| 4,824,544 | 4/1989 | Mikalesen et al. | 204/298.06 |
| 4,862,032 | 8/1989 | Kaufman et al. | 313/359.1 |
| 4,867,859 | 9/1989 | Harada et al. | 204/298.04 |
| 4,873,467 | 10/1989 | Kaufman et al. | 313/360.1 |
| 4,925,542 | 5/1990 | Kidd | 427/531 |
| 4,933,065 | 6/1990 | Seiler | 204/298.06 |
| 4,941,430 | 7/1990 | Watanabe et al. | 118/723 FE |
| 5,045,166 | 9/1991 | Bobbio | 204/192.32 |
| 5,069,770 | 12/1991 | Glocker | 204/192.12 |
| 5,334,302 | 8/1994 | Kubo et al. | 204/298.18 |
| 5,522,343 | 6/1996 | Kodama et al. | 118/723 MP |

Primary Examiner—M. Nuzzolillo
Assistant Examiner—Rodney G. McDonald
Attorney, Agent, or Firm—Klaas, Law, O'Meara & Malkin, P.C.; Bruce E. Dahl, Esq.

[57] ABSTRACT

Plasma processing apparatus may comprise a process chamber having a process gas supply for providing a process gas to the process chamber and a vacuum pump for maintaining the process chamber within a predetermined pressure range. A cathode/target assembly positioned within the process chamber is connected to a first terminal of an external power supply. An anode/ion source assembly is also positioned within the process chamber and may include an electrode member having a central aperture therein that defines an active surface on the electrode member. The electrode member is connected to a second terminal of the external power supply. A magnet positioned adjacent the electrode member produces an electron-confining magnetic tunnel adjacent the active surface of the electrode member. The electron-confining magnetic tunnel momentarily traps electrons adjacent the active surface, some of which ionize some of the process gas. A shield member having a central aperture therein surrounds the electrode member so that the central aperture of the shield member is generally aligned with the central aperture in the electrode member. The shield member is electrically insulated from the electrode member.

22 Claims, 8 Drawing Sheets

PLASMA PROCESSING SYSTEM UTILIZING COMBINED ANODE/ION SOURCE

FIELD OF INVENTION

This invention relates to plasma processing systems in general and more specifically to reactive sputter deposition systems.

BACKGROUND

Plasma deposition refers to any of a wide variety of processes in which a plasma is used to assist in the deposition of thin films or coatings onto the surfaces of objects. For example, plasma deposition processes are widely used in the electronics industry to fabricate integrated circuits and other electronic devices, as well as to fabricate the magnetic tapes and disks used in audio, video, and computer applications. Plasma deposition processes may also be used to apply various coatings to glass surfaces in the optics and architectural glass industries. Such plasma deposition processes may also be used in reverse, i.e., to remove material from the surfaces of objects, in which case they are usually referred to as plasma etching or plasma cleaning processes.

Regardless of whether the plasma process is used for deposition or cleaning, the plasma is usually created by subjecting a low-pressure process gas (e.g., argon) contained within a vacuum chamber to an electric field created between two electrodes. The electric field ionizes the process gas, creating the plasma. In the case of a sputter deposition plasma process, the ionized process gas atoms comprising the plasma impact the surface of the material (i.e., target) that is to be deposited on the object (i.e., substrate). As a result of the ion impacts, atoms of the target material are dislodged or sputtered from the surface of the target material and are released into the vacuum chamber. The substrate is usually positioned with respect to the target so that a majority of the sputtered atoms from the target material deposit themselves onto the surface of the substrate.

While sputter deposition processes of the type described above may be used to deposit metals or metal alloys (e.g., aluminum, nickel or cobalt) onto the substrate, they may be used to deposit compound compositions as well. Reactive sputter deposition is the name usually given to reactive sputtering processes which involve the sputtering of the target material in a reactive gas mixture in order to deposit a compound thin film comprising the sputtered target material and the reactive species. A wide variety of compounds, such as $SiO_2$, $Al_2O_3$, $Si_3N_4$, and $TiO$, can be deposited by reactive sputter deposition.

While reactive sputtering processes are known and have been used for years, they continue to be plagued by several problems. For example, it is common for the anode to slowly accumulate a layer of the compound material that is to be deposited on the surface of the substrate. Since the deposited compound material is usually an electrical insulator (e.g., an oxide), the gradual accumulation of the compound material on the anode will eventually result in a decrease in anode efficiency, with a commensurate decrease in the overall efficiency of the process. Worse yet, if the process chamber itself is connected as the anode, the entire chamber tends to accumulate a layer of the compound material, thereby necessitating the need for frequent cleaning and/or replacement of the entire process chamber.

The accumulation of the compound material on the anode can also cause other problems. For example, since the electrons seeking the anode take the path of least resistance, they tend to "find" certain low resistance areas on the anode where the accumulated coating is relatively thin. Since such low resistance areas are usually fairly small, the incoming electrons tend to heat the low resistance area to high temperatures. Such areas are referred to herein as "hot spots." In extreme cases, the temperature of a hot spot may increase to the point where it becomes incandescent. While the formation of hot spots is generally undesirable in that they can melt or partially melt the anode, they can be particularly serious where the anode is the process chamber, i.e., the hot spot may cause a "burn through" or breach in the process chamber wall.

Still another problem associated with reactive sputtering systems is that it is often difficult to establish (i.e., "light") and/or maintain the plasma due to the presence in the process chamber of the reactant gas species. One method of overcoming this problem has been to supply additional electrons to the process chamber by use of a separate electron emitter, such as a hot filament or thermionic emitter. Unfortunately, however, hot filaments are prone to rapid deterioration in the highly reactive atmosphere within the process chamber.

Consequently, a need exists for a reactive plasma processing system that is resistant to the formation on the anode of the compound material that is to be deposited on the surface of the substrate. Still other advantages could realized if such a system could provide increased ionization levels, thus making it easier to light and maintain the plasma.

SUMMARY OF THE INVENTION

Plasma processing apparatus may comprise a process chamber having a process gas supply for providing a process gas to the process chamber and a vacuum pump for maintaining the internal pressure of the process chamber within a predetermined range. A cathode/target assembly positioned within the process chamber is connected to a first terminal of an external power supply. An anode assembly is also positioned within the process chamber and may include an electrode member having a central aperture therein that defines an active surface on the electrode member. The electrode member is connected to a second terminal of the external power supply. A magnet positioned adjacent the electrode member produces an electron-confining magnetic tunnel adjacent the active surface of the electrode member. The electron-confining magnetic tunnel momentarily traps electrons adjacent the active surface, some of which ionize some of the process gas. A shield member having a central aperture therein surrounds the electrode member so that the central aperture of the shield member is generally aligned with the central aperture of the electrode member. The shield member is electrically insulated from the electrode member.

Also disclosed is a cathode/target assembly that incorporates an anode assembly. The cathode/target assembly includes a generally plate shaped target material having a central aperture therein. The target is connected to a first terminal of an external power supply. A magnet assembly positioned adjacent the back surface of the target produces a plasma-confining magnetic field adjacent the front surface of the target. The anode assembly is positioned in the central aperture of the target and comprises an electrode member having a central aperture therein that defines an active surface on the electrode member. The electrode member is connected to a second terminal of the external power supply. A magnet positioned adjacent the electrode member produces an electron-confining magnetic tunnel adjacent the active surface of the electrode member. The electron-confining magnetic tunnel momentarily traps electrons adjacent the active surface, some of which ionize some of the process gas. A shield member having a central aperture therein surrounds the electrode member so that the central aperture of the shield member is generally aligned with the central aperture of the electrode member. The shield member is electrically insulated from the electrode member.

A method for performing reactive sputter deposition may comprise the step of applying a voltage potential to a cathode/target assembly positioned within a process chamber that includes a process gas supply for providing a process gas to the interior of the chamber, a reactant gas supply for providing a reactant gas to the interior of the chamber, and a vacuum pump for maintaining the internal pressure of the process chamber within a predetermined range. A voltage potential is then applied to an anode assembly that comprises an electrode member having a central aperture therein that defines an active surface on the electrode member. A magnet positioned adjacent the electrode member produces an electron-confining tunnel adjacent the active surface of the electrode member. The voltage potential that is applied to the anode is positive with respect to the voltage potential on the cathode/target assembly. The voltage potential between the cathode/target assembly and the anode assembly is then periodically reversed so that the anode assembly has impressed upon it a voltage potential that is negative with respect to a voltage potential on the cathode/target assembly.

BRIEF DESCRIPTION OF THE DRAWINGS

Illustrative and presently preferred embodiments of the invention are shown in the accompanying drawings in which.

DETAILED DESCRIPTION OF THE INVENTION

Figure 1:
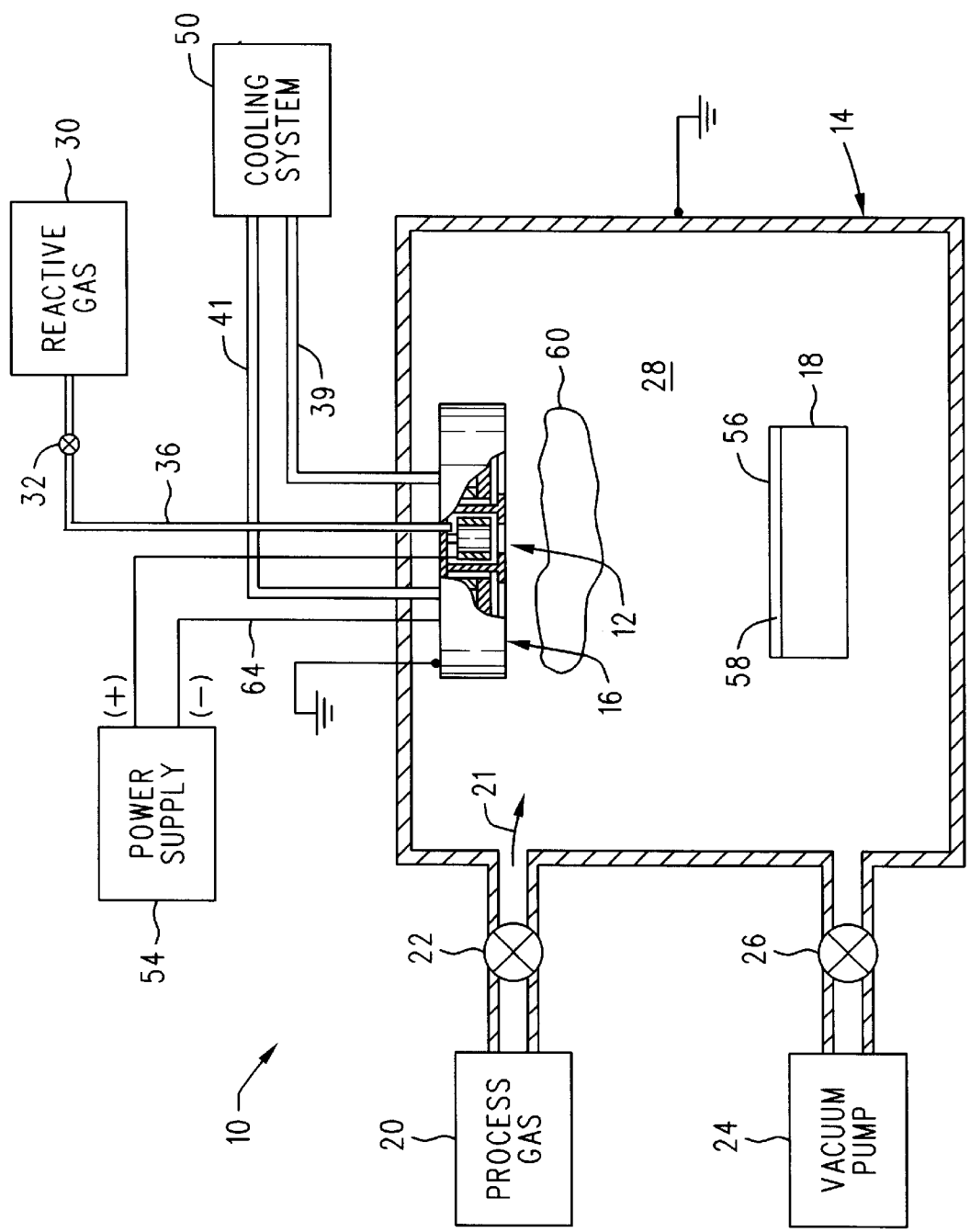
FIG. 1 is a schematic view of a plasma processing apparatus according to the present invention with a portion of the circular planar magnetron target/cathode assembly broken away to reveal the combination anode/ion source.
Figure 2:
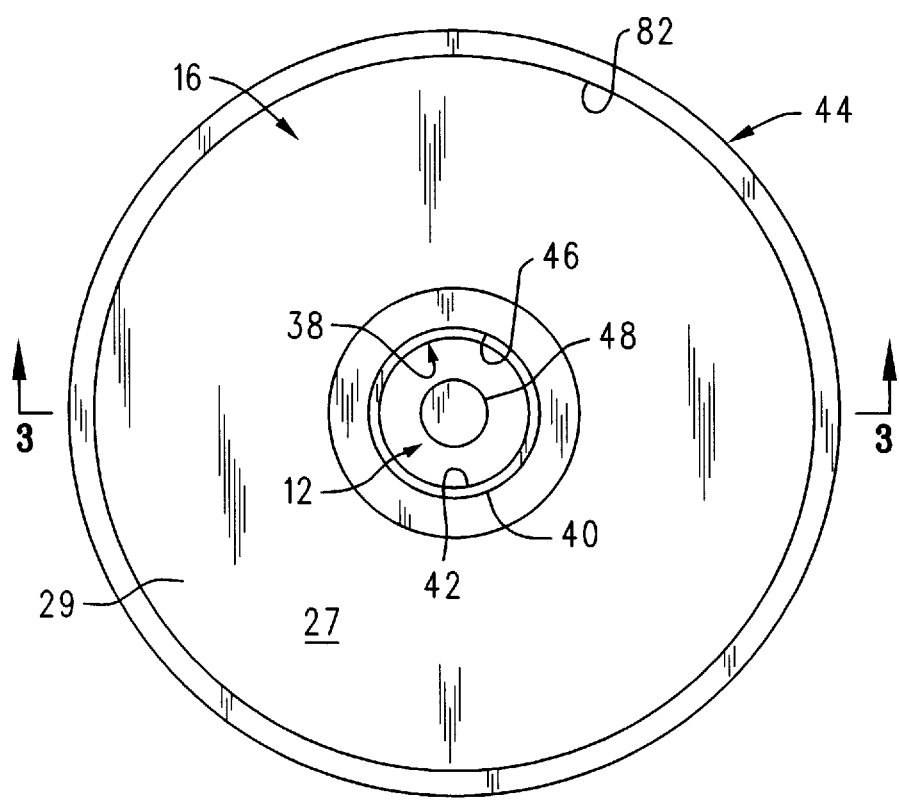
FIG. 2 is a plan view of the circular planar magnetron cathode/target assembly and combined anode/ion source assembly shown in FIG. 1.
Figure 3:
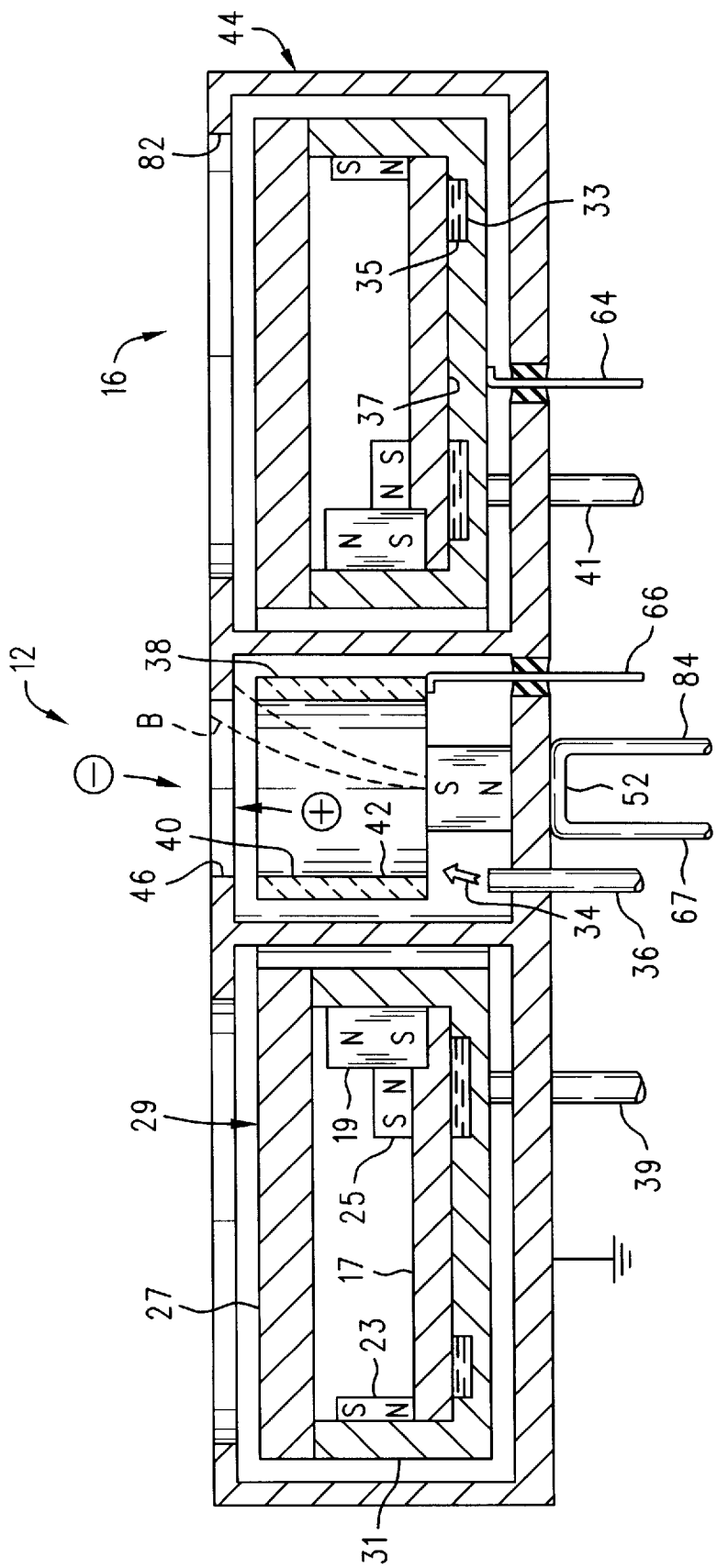
FIG. 3 is an enlarged cross-section view in elevation of the cathode/target assembly and combined anode/ion source assembly taken along the lines 3—3 of FIG. 2.
Figure 9:
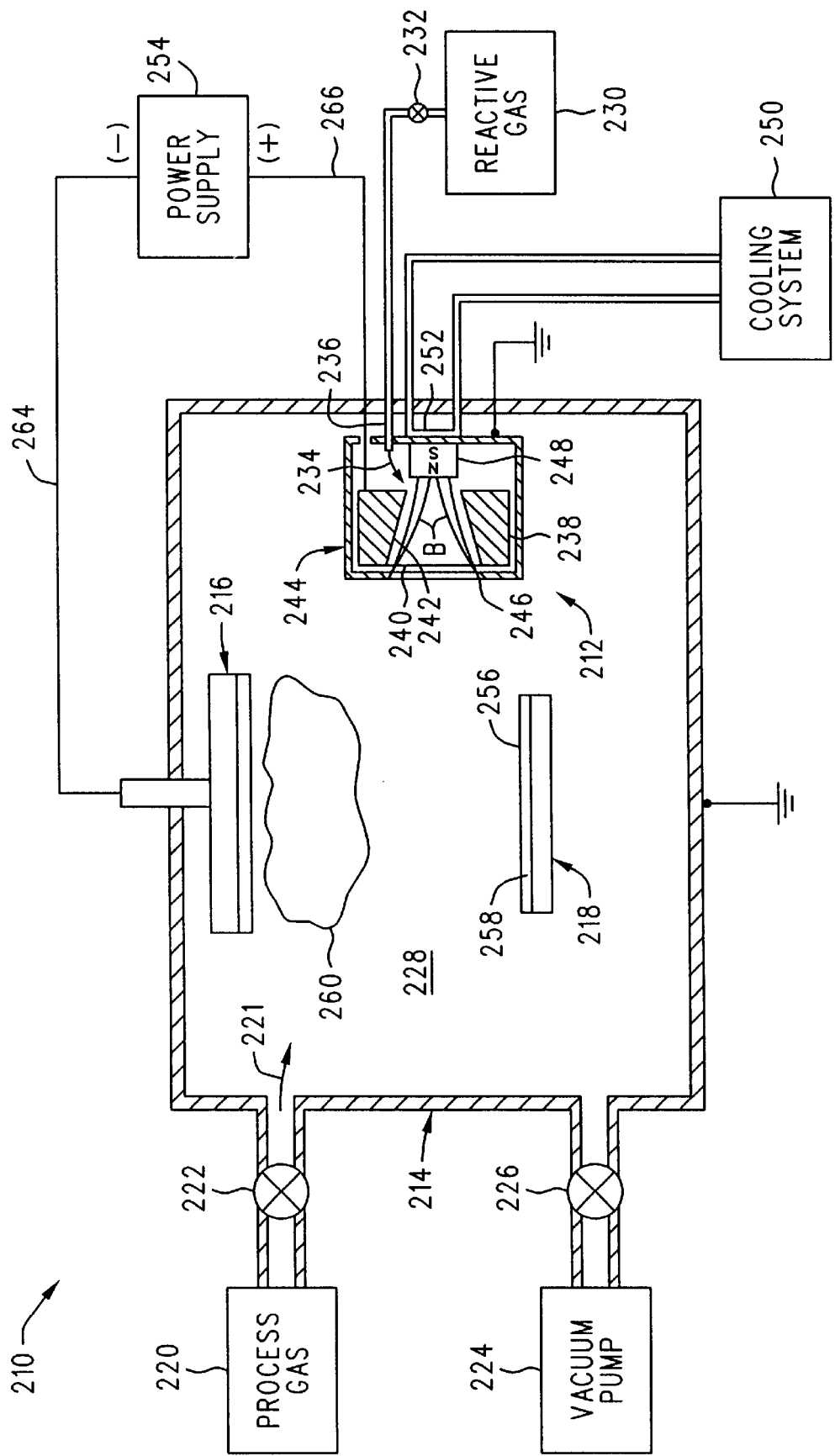
FIG. 9 is a schematic view of another embodiment of a plasma processing apparatus according to the present invention wherein the combined anode/ion source comprises a separate component.

The present invention is directed to a plasma processing system 10 having a combined anode/ion source 12. The combined anode/ion source 12 is highly resistant to the accumulation of the material that is to be deposited on the substrate, thereby making it ideal for use in reactive plasma deposition processes. The combined anode/ion source 12 also provides increased ionization of the process gas and/or reactant gas contained within the chamber, thereby making it easier to light and maintain the plasma. The combined anode/ion source 12 may comprise part of a cathode/target assembly 16, as shown in FIGS. 1–3. Alternatively, the anode/ion source may comprise a separate assembly 212, as shown in FIG. 9.

Referring now to FIG. 1, a plasma processing system 10 according to the present invention may comprise a vacuum or process chamber 14 that defines an interior region 28. The process chamber 14 also houses the combined anode/ion source assembly 12, a cathode/target assembly 16, and a substrate 18 which is to be coated. In the embodiment shown in FIGS. 1–3, the combined anode/ion source 12 is mounted within the central aperture of the cathode/target assembly 16. Alternatively, the anode/ion source may comprise a separate assembly 212, as shown in FIG. 9.

The process chamber 14 also has associated with it a number of other devices and systems necessary or desirable for performing the desired plasma processes. For example, in one preferred embodiment, a process gas source 20 is connected to the process chamber 14 via a process gas valve 22. The process gas source 20 provides a suitable process gas 21, such as argon, to the vacuum or process chamber 14. Similarly, a reactant gas source 30 is connected to the process chamber 14 and provides a reactant gas 34 (FIG. 3) to the interior 28 of the process chamber 14. A reactant gas supply valve 32 regulates the flow of the reactant gas 34 into the interior 28 of chamber 14. A vacuum pump assembly 24 connected to the vacuum chamber 14 via a vacuum valve assembly 26 maintains the interior 28 of the vacuum chamber 14 at a pressure suitable for carrying out the desired process. A cooling system 50 may also be provided to cool the various components of the cathode/target assembly 16 and the combined anode/ion source assembly 12, as will be described in greater detail below.

The combined anode/ion source assembly 12 is a central feature of the present invention and may be incorporated into the target/cathode assembly 16, as shown in FIGS. 1–3. Alternatively, the combined anode/ion assembly may comprise a separate assembly, as shown in FIG. 9. Referring now primarily to FIG. 3, with occasional reference to FIGS. 1 and 2, the combined anode/ion source assembly 12 may comprise a generally cylindrically shaped electrode element 38 having a central aperture 40 therein that defines an active surface 42. The electrode element 38 is surrounded by a shield assembly 44 having a central aperture 46 that is generally aligned with the central aperture 40 of the electrode element 38. A magnet assembly 48 comprising a north pole N and a south pole S is mounted to the shield assembly 44 so that the magnetic field B produced thereby forms an electron-confining tunnel adjacent the active surface 42 of electrode element 38. A heat sink 52 mounted to the shield assembly 44 removes heat from the magnet assembly 48 to keep it from exceeding its Curie temperature, i.e., from losing its magnetism. As used herein the term "Curie temperature" refers to that temperature below which a magnetic material exhibits ferromagnetism and above which ferromagnetism is destroyed and the material is paramagnetic. The Curie temperature of a magnetic material may be different depending on whether the magnetic material is placed in a "closed loop" magnetic field or an "open loop" magnetic field. Generally speaking, for a given magnetic material, the Curie temperature is lower when the material is in an open loop magnetic field. In one preferred embodiment, the heat sink 52 is connected to the cooling system 50 (FIG. 1) by suitable coolant pipes 67, 84 (FIG. 3).

The cathode/target assembly 16 and the combined anode/ion source assembly 12 are electrically connected to a power supply 54 by any convenient means, such as by a pair of conductors 64, 66. See also FIG. 1. More specifically, the electrode element 38 of the combined anode/ion source assembly 12 is connected to the positive (+) terminal of the power supply 54 by conductor 66. The negative (−) terminal of the power supply 54 is connected to the cathode/target assembly 16 by conductor 64. The shield assembly 44 may be grounded, as may the process or vacuum chamber 14.

Before proceeding with a brief description of the operation of the invention, it will be useful to first define certain terms commonly used in the field of plasma processing and that are used herein. The term "plasma" (or, alternatively, "glow discharge") is usually defined as a region of high temperature gas containing large numbers of free electrons and ions. When used in the context of plasma processing technology, some persons consider the "plasma" as extending throughout the entire chamber. Others, however, consider the plasma as being limited substantially to the region of the "glow discharge" (i.e., generally over the surface of the cathode/target) since the glow discharge region is readily visually discernable. As used herein, the term "plasma" shall mean the latter of the two definitions. That is, the term "plasma" shall refer to the region substantially coincident with the glow discharge. Accordingly, the plasma 60 is confined to that region generally over the surface 27 of the target material 29 that comprises the cathode/target assembly 16, as shown schematically in FIG. 1.

Many of the ions comprising the plasma 60 are produced by collisions with electrons that originate from the cathode/target 16. However, other electrons may be liberated by the ion bombardment of the cathode and by the ionization of the process and/or reactant gases. These electrons may also result in the formation of additional ions. In any event, all of the electrons are drawn toward positively charged elements contained within the vacuum chamber and are repelled by negatively charged elements.

Referring back now to FIGS. 1–3, the plasma processing system 10 may be operated as follows to deposit a compound film 56 onto the surface 58 of the substrate 18 being coated. The electric field (not shown) created between the cathode/target assembly 16 and the anode/ion source assembly 12 by the power supply 54 ionizes a portion the process gas 21 (e.g. argon) which then forms a plasma 60. The positively charged ions (indicated by the encircled "+" sign in FIG. 3, i.e., ⊕) in the plasma 60 are accelerated toward the negatively charged cathode/target assembly 16, whereupon they dislodge or sputter atoms from the target material. The sputtered atoms (not shown) migrate through the interior 28 of the chamber 14 and react with the reactant gas 34 and/or reactant gas ions to form a compound material (not shown). The compound material then condenses on the surface 58 of the substrate 18 as a compound film 56. See FIG. 1.

The electrons (indicated by the encircled "−" sign in FIG. 3, i.e., ⊖) in the interior 28 of the chamber 14 migrate toward the positively charged electrode element 38 that comprises the combined anode/ion source assembly 12. However, instead of directly impacting the surface 42 of the electrode element 38 and then returning to the power supply 54, the electrons are momentarily trapped within the electron-confining magnetic field B that exists over the active surface 42 of the electrode element 38.

The momentarily trapped electrons produce at least two effects. First, the trapped electrons ionize additional process gas 21 atoms/molecules and reactant gas 34 atoms/molecules to provide additional process gas ions and reactant gas ions to the interior 28 of the chamber 14. The respective ions, which are positively charged, are repelled by the positively charged electrode element 38 and exit through the central aperture 46 in the shield assembly 44, whereupon they migrate toward the cathode/target assembly 16. The additional process gas ions generally increase the sputtering rate, whereas the additional reactant gas ions generally increase the rate of formation of the compound material that is being deposited on the surface 58 of substrate 18.

The second effect of the momentarily trapped electrons is that they significantly increase the temperature of the electrode element 38. The temperature increase is not insubstantial, and during normal operating conditions it is not uncommon for the electrode element 38 to be heated to the point of incandescence (e.g., temperatures typically in the range of about 200° C. to about 700° C.). The extreme temperature of the electrode element 38 significantly reduces the tendency of the compound film to condense on the element 38.

It is generally preferred that the power supply 54 comprise a pulsed power supply to momentarily reverse the polarity on the cathode/target 16 and the anode/ion source 12. The momentary polarity reversal reduces arcing between various components within the process chamber 14.

Figure 4:
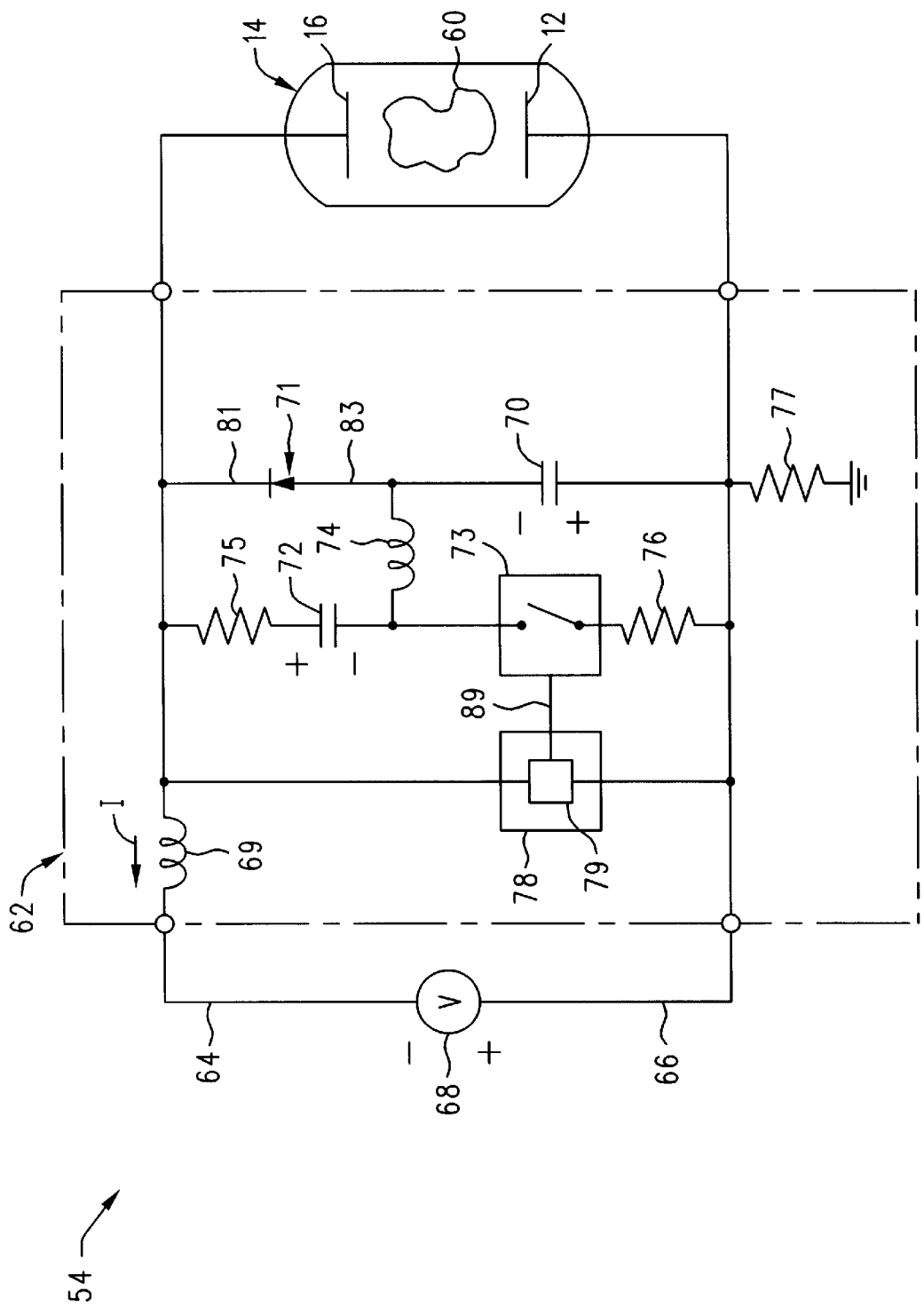
FIG. 4 is an electrical schematic of a circuit for reversing the polarity between the cathode and anode.

Referring now to FIGS. 1 and 4, one embodiment of a pulsed power supply 54 may comprise a polarity reversing circuit 62 that is electrically connected between the conductors 64 and 66 that connect the respective negative (−) and positive (+) terminals of a d.c. power supply 68 to the cathode 16 and combined anode/ion source 12 (both of which are shown as plates in FIG. 4 for simplicity). The polarity reversing circuit 62 may comprise a first inductor 69 connected in series between the negative (−) terminal of the d.c. power supply 68 and the cathode 16. The first inductor 69 allows the d.c. power supply 68 to deliver a substantially constant current to the plasma 60 regardless of short duration voltage fluctuations that may occur as a result of changes in the plasma 60 or the overall process contained within vacuum chamber 14.

A first capacitor 70, along with a diode 71, are connected between the cathode 16 and the combined anode/ion source 12 in the manner shown. A second capacitor 72 and a switching device 73 are also connected between the cathode 16 and the combined anode/ion source 12 in a generally parallel arrangement with respect to the first capacitor 70 and diode 71. A second inductor 74 is connected between the first and second capacitors 70 and 72. As will be described in greater detail below, an optional first resistor 75 may be connected in series between the second capacitor 72 and the cathode 16. An optional second resistor 76 may be connected between the switching device 73 and the combined anode/ion source 12. Similarly, an optional third resistor 77 may be connected between the combined anode/ion source 12 and ground.

The polarity reversing circuit 62 may also include a switch actuation circuit 78 for periodically cycling the switching device 73 between a non-conducting (e.g., open) state and a conducting (e.g., closed) state. In one preferred embodiment, the switch actuation circuit 78 may also include an arc detection circuit 79 for detecting the occurrence of an arc condition.

As will be explained in greater detail below, the second inductor 74, along with the respective first and second capacitors 70 and 72, form an LC (i.e., inductive-capacitive) circuit which transfers energy stored in the second inductor 74 and first capacitor 70 into the second capacitor 72 during those times when the switching device 73 switches between the conducting state and the non-conducting state. Further, the first capacitor 70, along with diode 71, functions as a voltage limiter or clamp to prevent excessive negative voltages from being imposed on the cathode 16 immediately following the opening of switch device 73.

The pulsed d.c. power supply 54 may be operated in one of two modes depending on the desired performance of the circuit. In the first mode, referred to herein as the "passive arc suppression mode," the circuit 62 is operated in such a manner that the switch actuation circuit 78 periodically closes the switching device 73, thus reversing the polarity on the electrodes 16, 12 (i.e., the cathode and combined anode/ion source, respectively). This periodic reversing of the polarity on the electrodes 16, 12 tends to remove any space charges that may have accumulated on the electrodes 16, 12, thereby effectively preventing the development of conditions likely to lead to arcing. In most processing modes, such a periodic voltage polarity reversal will be sufficient to prevent the occurrence of arcs. However, in the event more robust arc suppression is desired or required, the circuit 62 may be provided with an optional arc detection circuit 79.

When provided with the arc detection circuit 79, the overall circuit 62 may be operated in an "active arc suppression mode" in which the switching device 73 is actuated any time an arc condition is detected. As explained above, the actuation of the switching device 73 has the effect of almost immediately reversing the voltage potential on the electrodes 16 and 12, thus quenching the arc before it has a chance to fully develop and adversely affect the coating process.

Figure 5:
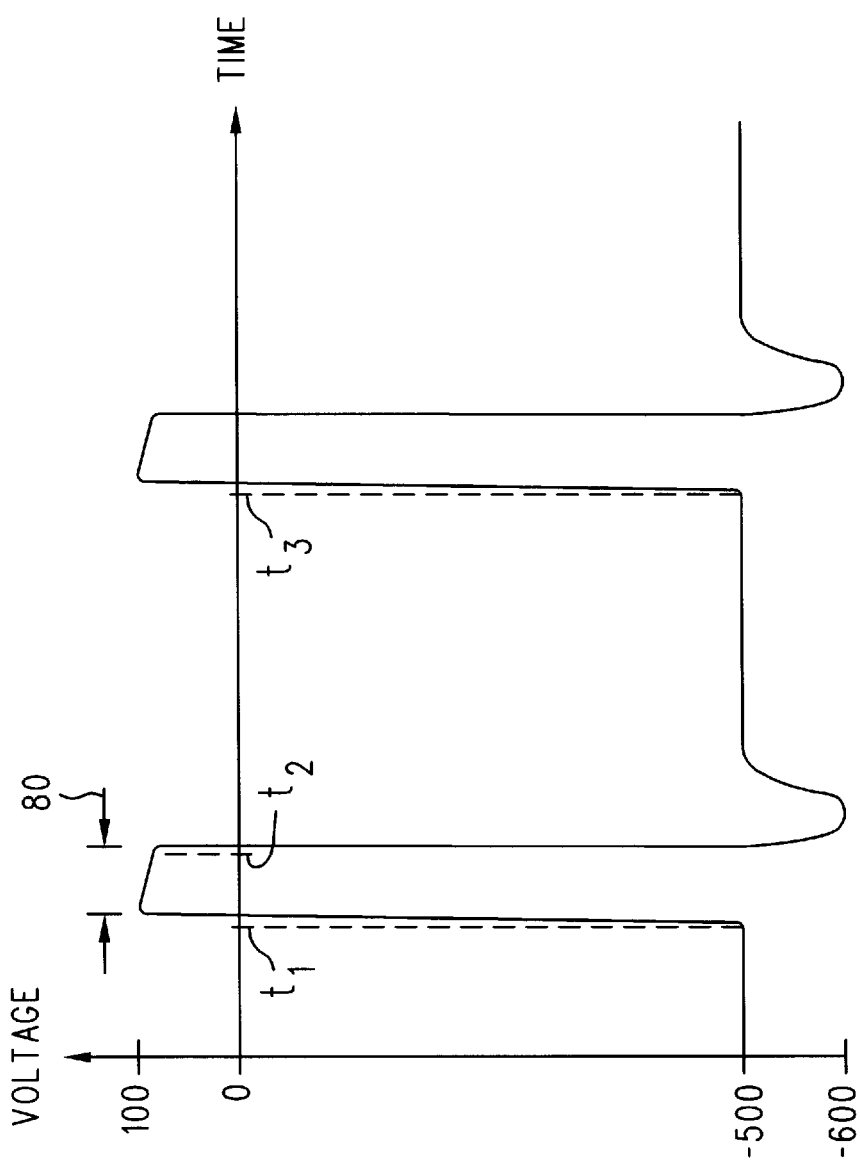
FIG. 5 is a graph of a typical voltage signal imposed on the cathode by the circuit shown in FIG. 4.

The operation of the circuit 62 in the passive arc suppression mode is best understood by referring to FIGS. 4 and 5. In order to accomplish the desired plasma deposition process, the voltage on the cathode 16 is maintained at a strong negative potential (e.g., −500 volts) with respect to the anode/ion source 12 during the time when the switching device 73 is in the non-conductive state (i.e., open). During this time, the process is more or less operating in a steady state, with a substantially constant current I flowing through the first inductor 69 in the direction indicated by the arrow (i.e., the direction of positive current flow). As will be explained in greater detail below, the second capacitor 72 will have a net reverse charge (indicated by the "+" and "−" signs) across its plates with respect to the polarity across the electrodes 16 and 12. That is, the plate of the second capacitor 72 that is connected to the cathode 16 through resistor 75 will have a voltage potential substantially equal to the voltage potential on the cathode 16, while the other plate of capacitor 72, i.e., the plate connected to the second inductor 28, will have a slightly greater negative voltage (e.g., −600 V). Consequently, the second capacitor 72 will have a relative charge as indicated by the (+) and (−) signs shown in FIG. 4. The first capacitor 70 will essentially have the relative charge in the sense also indicated by the (+) and (−) signs shown in FIG. 4.

At a certain time $t_1$, (FIG. 5), the switch actuation circuit 78 actuates the switching device 73 to change it from the non-conductive (i.e., open) state to the conductive (i.e., closed) state. The second capacitor 72 will now be connected directly across the cathode 16 and combined anode/ion source 12, essentially instantly reversing the charge on the electrodes. That is, the charge on the cathode 16 will now be essentially 100 volts positive with respect to the charge on the anode/ion source 12. See FIG. 5. This 100 volt potential, plus the 500 volt potential of the power supply 68, i.e., a total of 600 volts, is impressed across inductor 69, causing the current I flowing through the first inductor 69 to increase in a substantially linear fashion.

Before the second capacitor 72 is discharged by a significant amount, the switch actuation circuit 78 again actuates the switching device 73, causing it to return to the non-conductive (i.e., open) state at a time $t_2$. At this point, the increased current I flowing through the first inductor 69 causes the voltage on the cathode 16 to more or less instantly swing negative with respect to the anode/ion source 12. However, instead of stopping at the previous potential of about −500 V, the increased current I flowing through the first inductor 69 and the increased initial impedance of the non-conducting plasma 60 causes the voltage on the cathode 16 to continue to go negative. The first capacitor 70 and the diode 71 now act as a voltage limiter or clamp to prevent the voltage on the first capacitor 70 from exceeding about −600 volts. The clamped energy is stored in capacitor 70. Then, as the plasma 60 begins to conduct, the voltage on the cathode 16 decreases until it again reaches about −500 volts with respect to the anode/ion source 12 and the current I through the first inductor 69 decays to its original value. The switching device 73 remains in the non-conducting (i.e., open) state until a time $t_3$, when it is again switched to the conducting (i.e., closed) state, as described above.

The second inductor 74 prevents excessive current from flowing through the switching device 73 when it is conducting. The second inductor 74 also provides resonant recharging of the second capacitor 72 from the first capacitor 70 when the switching device 73 is in the non-conducting state. That is, the charge collected by the first capacitor 70 during the clamping process is transferred to the second capacitor 72 when switching device 73 is in the non-conducting state.

It is important that the duration of the periodic voltage reversal cycle 80 (i.e., $t_2$–$t_1$) be considerably shorter than the duration of the "normal" voltage cycle (i.e., $t_3$–$t_2$) in order to prevent, or at least significantly reduce, sputtering of the anode 12. In one preferred embodiment, the ratio of the duration of the "normal" voltage cycle to the duration of the voltage reversal cycle 80 should be greater than or equal to about 5:1. That is, the duration of the "normal" voltage cycle should be at least about 5 times longer than the duration of the voltage reversal cycle 80.

If the circuit 62 is provided with an arc detection circuit 79, then it may be operated in the "active arc suppression mode." The active arc suppression mode is essentially identical to the passive arc suppression mode except that the switching device 73 is activated (i.e., closed) whenever an arc condition is detected by the arc detection circuit 79. Therefore, when operated in the active mode, the circuit 62 will be capable of quenching an arc that may unexpectedly develop during the time between the periodic voltage reversal cycles 80, e.g., during the time between $t_2$ and $t_3$. See FIG. 5.

Several significant advantages are associated with the plasma processing system 10 according to the present invention. For example, the combined anode/ion source assembly 12 is highly resistant to the accumulation of sputtered material and/or the compound material that is to be deposited on the substrate. Consequently, the invention is ideally suited to use in reactive plasma deposition processes. Another significant advantage of the present invention is that it provides additional ions to the process chamber, thereby enhancing the overall efficiency of the process. Further, if the improved anode/ion source is used in reactive processes, the additional ionization of the reactant gas tends to increase the formation of the compound material that is to be deposited on the surface of the substrate, again enhancing the overall efficiency of the process.

Still another advantage of the combined anode/ion source 12 is that it provides the additional ionization of the process gas and/or reactant gas without the need to resort to separate thermionic electron emitters, such as hot filaments, which can be deleterious to the process being performed within the process chamber and, in any event, tend to be short-lived in reactive plasma deposition systems.

Having briefly described the plasma processing system 10 according to the present invention, as well as some of its more significant features and advantages, the plasma processing system 10 will now be described in detail.

Referring back now to FIG. 1, the plasma processing system 10 according to the present invention is shown and described herein as it could be used to accomplish reactive sputter deposition, i.e., the deposition of thin films and coatings that comprise a compound formed from the sputtered species and the reactant gas, or some component of the reactant gas. Alternatively, however, the plasma processing system 10 may be used to perform other types of processes, such as conventional sputter deposition, sputter cleaning (etching) or any of a wide range of other plasma processes well-known to persons having ordinary skill in the art. Accordingly, the present invention should not be regarded as being limited to only reactive sputter deposition processes.

The plasma processing system 10 may comprise a vacuum or process chamber 14 for housing the combined anode/ion source assembly 12, a cathode/target assembly 16, and the substrate 18 on which the coating is to be deposited. In the embodiment shown in FIG. 1, the combined anode/ion source assembly 12 is incorporated into the cathode/target assembly 16, as best seen in FIGS. 2 and 3. Alternatively, and as will be described below, the combined anode/ion source may comprise a separate assembly 212, as best seen in FIG. 9. A process gas supply 20 is connected to the process chamber 14 via a process gas valve assembly 22. The process gas valve 22 regulates the flow of a process gas (indicated by arrow 21), into the interior 28 of the process chamber 14. In one preferred embodiment, the process gas 21 may comprise argon, although other gases may also be used. A vacuum pump assembly 24 connected to the vacuum chamber 14 via a valve assembly 26 maintains the interior 28 of the process chamber 14 at a pressure suitable for carrying out the desired process. For example, in most magnetron reactive sputter deposition processes it is usually desirable to maintain the interior 28 of the process chamber 14 at a pressure of about 1 mTorr, although other pressures could also be used depending on the type of process being performed.

Since the plasma processing system 10 shown and described herein is configured to accomplish reactive sputter deposition, the processing system 10 also includes a reactant gas source 30 that contains a supply of a suitable reactant gas (indicated by arrow 34 in FIG. 3). Examples of suitable reactant gases include, but are not limited to, oxygen ($O_2$), nitrogen ($N_2$), and hydrogen sulfide ($H_2S$). A valve assembly 32 regulates the flow of the reactant gas 34 into the interior 28 of process chamber 14. In one preferred embodiment, the reactant gas is discharged through a reactant gas discharge nozzle 36 that is positioned anterior the electrode element 38 of the combined anode/ion source assembly 12. See FIG. 3.

As mentioned above, in the embodiment shown in FIGS. 1–3 the combined anode/ion source assembly 12 is incorporated into the cathode/target assembly 16. Referring now to FIGS. 2 and 3, with occasional reference to FIG. 1, the combined anode/ion source assembly 12 is positioned at about the center of a planar magnetron cathode/target assembly 16 having a generally circular target 29. In one preferred embodiment, the cathode/target assembly 16 may comprise a magnetron assembly of the type shown in described in U.S. Pat. No. 5,262,028, which is incorporated herein by reference for all that it discloses. Alternatively, the cathode/target assembly could comprise any of a wide-range of other types of cathode/target assemblies well-known in the art.

The circular cathode target assembly 16 may comprise a generally circular base plate or pole piece 17 for supporting a plurality of permanent magnets. Specifically, pole piece 17 supports an inner magnet 19 and an outer magnet 23. The north poles (N) and south poles (S) of the inner and outer magnets 19 and 23 may be oriented as shown. An intermediate magnet 25 may be positioned adjacent inner magnet 19 and may have its north pole (N) and south pole (S) oriented generally as shown. Alternatively, the various magnets 19, 23, and 25 may be positioned on the pole piece 17 so that their respective magnetic poles have opposite orientations. The various magnets 19, 23, and 25 produce a plasma-confining magnetic field (not shown) over the front surface 27 of target 29. The magnetic field confines the electrons over the surface 27 of the target 29, which generally increases the ionization of the process gas and improves the sputtering rate and overall target utilization.

In one preferred embodiment, the magnets 19, 23, and 25 comprise rare-earth neodymium-iron-boron (NdFeB) magnets having magnetic field energy products of about 35 megagauss-oersted. However, other types of rare earth magnets, such as samarium cobalt (SmCo) magnets, may also be used. Good results can also be obtained with ceramic magnets, such as barium or strontium ferrite magnets, although their magnetic field energy products are generally lower. Alternatively, the magnets 19, 23, and 25 may comprise an electromagnet or electromagnets.

It is generally preferred that the pole piece 17 comprise a ferromagnetic material, such as magnetic stainless steel. As used herein, the term "ferromagnetic" refers to those metals, alloys, and compounds of the transition (iron group) rare-earth and actinide elements in which the internal magnetic moments spontaneously organize in a common direction, giving rise to a magnetic permeability considerably greater than that of vacuum and to magnetic hysteresis. Ferromagnetic materials may include, without limitation, iron, nickel, cobalt, and various alloys thereof.

The pole piece 17 may be mounted to a backing plate 31, which in turn supports the target material 29, as best seen in FIG. 3. The backing plate 31 may also include a plurality of coolant passages 33 therein for allowing a liquid coolant 35, such as water, too circulate adjacent the back surface 37 of pole piece 17. The various passages 33 in the backing plate 31 are connected to an inlet pipe 39 and outlet pipe 41. The coolant 35 may be provided by a suitable cooling system 50, as best seen in FIG. 1. The coolant 35 is used to keep the various magnets 19, 23, and 25 from exceeding their respective Curie temperatures, i.e., from losing their magnetism. As used herein, the term "Curie temperature" refers to that temperature below which a magnetic material exhibits ferromagnetism and above which ferromagnetism is destroyed and the material is paramagnetic.

The backing plate 31 may be made from a non-ferromagnetic material, preferably having good thermal conductivity. For example, in one preferred embodiment, the backing plate 31 comprises copper, although other materials could also be used.

The cathode/target assembly 16 may be electrically connected to the negative (−) terminal of the power supply 54 by a suitable conductor 64. See FIGS. 3 and 4.

The entire cathode/target assembly 16 is surrounded by a shield assembly 44, which also encloses the combined anode/ion source assembly 12. The shield assembly 44 includes an annular aperture 82 which exposes the front surface 27 of target 29 to the interior 28 of the process chamber 14. The shield 44 also includes a central aperture 46 which exposes the combined anode/ion source assembly 12 to the interior 28 of process chamber 14. The shield assembly 44 should be electrically isolated from the cathode/target assembly 16 and the combined anode/ion source assembly 12. Preferably, shield 44 should be grounded. In one preferred embodiment, the shield assembly 44 may comprise a non-ferromagnetic material, such as 304 stainless steel.

The combined anode/ion source assembly 12 is positioned within the shield assembly 44 as best seen in FIG. 3 and comprises a generally cylindrically shaped electrode member 38 having a central aperture 40 therein that defines an active surface 42. The electrode member 38 is electrically connected to the positive (+) terminal of the power supply 54 by conductor 66. See also FIGS. 1 and 4.

A magnet assembly 48 having a north pole (N) and a south pole (S) is mounted to the shield assembly 44 so that the magnetic field B produced by the magnet 48 arches over the active surface 42 of the electrode element 38, generally in the manner shown in FIG. 3. The magnetic field B forms an electron trap or tunnel which confines electrons over the active surface 42 of the electrode element 38.

The magnet assembly 48 may comprise a permanent magnet suitable for producing a magnetic field B having sufficient strength to confine the electrons over the active surface 42 of the electrode member 38 for a time sufficient to achieve the desired degree of ionization of the reactant gas 34 and/or process gas 21. By way of example, the magnetic field may have a strength in the range of about 25 gauss to 1000 gauss in an area extending from the active surface 42 of electrode element 38 to a distance of about 25 mm away from the active surface 42. Alternatively, other magnetic field strengths may be desired or required depending on the particular process being performed, the average energies of the electrons, and the desired degree of heating of the electrode 38 and/or ionization of the reactant gas 34.

In one preferred embodiment, the magnet 48 comprises a rare-earth neodymium-iron-boron (NdFeB) magnet having a magnetic field energy product of about 35 megagauss-oersted. However, other types of rare earth magnets, such as samarium cobalt (SmCo) magnets, may also be used. Good results can also be obtained with ceramic magnets, such as barium or strontium ferrite magnets, although their magnetic field energy products are generally lower. Alternatively, the magnet 48 may comprise an electromagnet.

As will be described in greater detail below, the electrode member 38 operates at relatively high temperatures, typically in the range of about 100° C. to 600° C. Consequently, it is preferred that the electrode member 38 comprise an electrically conductive refractory material, such as, for example, carbon, 304 stainless steel, molybdenum, and tantalum, although other materials may be used. In one preferred embodiment, the electrode member 38 comprises carbon.

In order to keep the magnet 48 below its Curie temperature, a heat sink 52 is provided adjacent the back surface of the shield 44. In one preferred embodiment, the heat sink 52 is connected to a pair of pipes 67, 84 through which circulates a coolant (not shown) (e.g., water) provided by the cooling system 50 (FIG. 1).

It is preferred, but not required, that the reactant gas 34 be introduced into the interior 28 of the process chamber 14 (FIG. 1) at a point near the combined anode/ion source assembly 12. In one preferred embodiment, the outlet nozzle 36 from the reactant gas supply 30 is positioned adjacent the magnet 48, generally between the electrode member 38 and the shield assembly 44, as best seen in FIG. 3.

The details of the pulsed power supply 54 are best seen in FIGS. 4–7. In one preferred embodiment, the pulsed direct current power supply 54 may comprise a polarity reversing circuit 62 that is electrically connected between the conductors 64 and 66 that connect the respective negative (−) and positive (+) terminals of a d.c. power supply 68 to the cathode 16 and combined anode/ion source 12 (both of which are shown as plates in FIG. 4 for simplicity). While the polarity reversing circuit 62 is shown as it may be used in conjunction with a conventional DC power supply 68 of the constant voltage design, other types of power supplies, such as constant current power supplies, could also be used.

The voltage reversal circuit 62 comprises a first inductor 69 connected in series with the negative (−) terminal of power supply 68 and the cathode/target assembly 16 contained within the vacuum chamber 14. The first inductor 69 adds a substantial amount of reactance to the circuit 62 thus allowing the plasma process to operate at substantially constant current, at least for short term transient impedance variations that may occur in the plasma 60. That is, the current flowing through the plasma 60 will be substantially constant regardless of the voltage potential between the cathode/target 16 and the combined anode/ion source 12. While the amount of inductance of the first inductor 69 is not particularly critical, it should be large enough to provide sufficient reactance to the circuit to allow the plasma process to be operated at substantially constant current for the typically expected transient impedance variations in the plasma 60. In one preferred embodiment, the first inductor 69 comprises a 1.5 mH choke.

The cathode 81 of diode 71 is also connected to the cathode/target assembly 16, whereas the anode 83 is connected to one lead of a first capacitor 70. The other lead of first capacitor 70 is connected to the combined anode/ion source 12. As was described above, the series arrangement of the first capacitor 70 and diode 71 forms a voltage limiter or clamp to prevent excessive negative voltages from being imposed on the cathode/target 16 when the switching device 73 is opened. The selection of the diode 71 will, of course, depend on the capacity of the particular power supply 68, the expected peak voltages and currents, as well as the values chosen for the other components in the circuit 62. However, in one preferred embodiment, the diode 71 may comprise a single diode rated for 800 volts and 6 amperes. Alternatively, a combination of diodes may be used, as would be obvious to persons having ordinary skill in the art.

The value of the first capacitor 70 must be selected so that it will not discharge significantly during the longest conducting period of switching device 73 at the maximum load current, i.e., the time between $t_1$ and $t_2$. Further, the LC resonant circuit that comprises the first and second capacitors 70 and 72 and the second inductor 74 should have a sufficiently long time constant so that the second capacitor 72 will be positively charged when the switching device 73 is again switched to the conducting state. The range of values for the first capacitor 70 will be described later.

The second capacitor 72 and the switching device 73 are connected in series across the first and second conductors 64 and 66 in the manner shown in FIG. 4. It is preferred, but not required, that a first resistor 75 be connected in series between the capacitor 72 and the conductor 64 and a second resistor 76 be connected in series between the switching device 73 and the conductor 66. Although both resistors 75 and 76 act as current limiters to protect their associated components, resistor 76 also provides current limiting information to the switch actuation circuit 78. In one preferred embodiment, the first resistor 75 may have a value in the range of 1 ohm ($\Omega$) to 50$\Omega$ (8$\Omega$ preferred). The second resistor 76 may have a value in the range of 10 milliohms (m$\Omega$) to 100 m$\Omega$ (50 m$\Omega$ preferred). Finally, the second inductor 74 is connected between the first and second capacitors 70 and 72, respectively.

As was described above, the first and second capacitors 70 and 72, along with the second inductor 74, form an LC resonant circuit. In order to provide good performance, the time constant of the resonant circuit should be selected so that it is at least four (4) times longer than the expected length of the non-conducting period of switching device 73 (i-e., the period between $t_2$ and $t_3$) at the slowest cycle rate. See FIG. 5. It is preferred, but not required, that the time constant of the LC resonant circuit be about one (1) order of magnitude (i.e., about 10 times) longer than the length of the non-conducting period (i.e., $t_3$–$t_2$). Thus, in one preferred embodiment having a non-conducting time period $t_3$–$t_2$ in the range of 20–60 microseconds ($\mu s$), the time constant of the resonant circuit should be selected to be about 600 $\mu s$. Therefore, any values for the second inductor 74 and the first and second capacitors 70 and 72 that will yield such a time constant usually will suffice. In one preferred embodiment, the first capacitor 70 has a value in the range of about 1 microfarads ($\mu F$) to 10 $\mu F$ (1 $\mu F$ preferred), the second capacitor 72 a value in the range of 1 $\mu F$ to 10 $\mu F$ (1 $\mu F$ preferred), and the inductor 74 has a value of about 5 millihenries (mH) to 10 mH (10 mH preferred).

The switching device 73 may comprise any number of semiconductor switching devices suitable for switching the anticipated currents at a suitable speed (e.g., 0.1 $\mu s$). Examples of such semiconductor switching devices include, but are not limited to, bi-polar transistors, insulated gate bi-polar transistors (IGBTs), field-effect transistors (FETs), thyristors, etc., that are readily commercially available and well-known to persons having ordinary skill in the art. Alternatively, non-semiconductor switching devices may also be used, provided such devices are capable of switching the anticipated voltages and currents at the speeds required. Consequently, the present invention should not be regarded as limited to any particular switching device or family of switching devices. However, in order to assist in the understanding of the circuit 62, the switching device 73 used in one particular embodiment will now be described.

Figure 6:
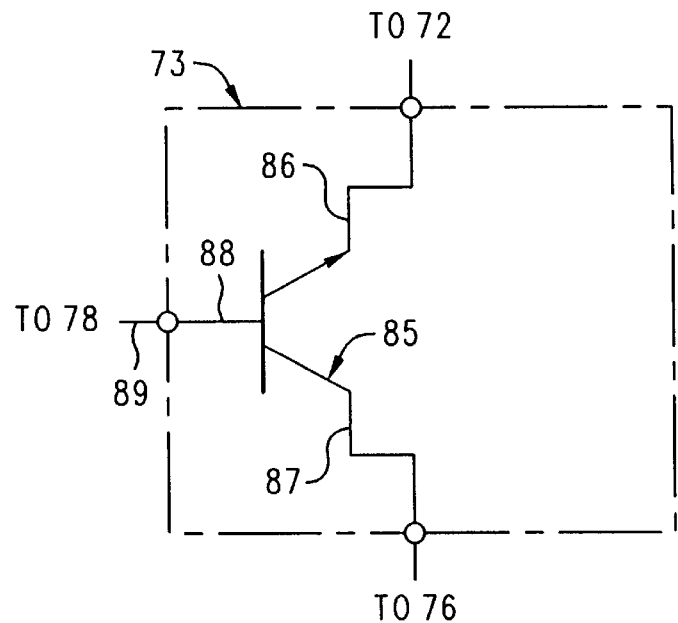
FIG. 6 is an electrical schematic of a switching device.

Referring to FIG. 6, one type of switching device 73 may comprise a single high-speed bi-polar switching transistor 85. More specifically, the emitter 86 of transistor 85 is connected to the second capacitor 72, while the collector 87 is connected to resistor 76. See also FIG. 4. The base 88 of transistor 85 is connected to the switch actuation circuit 78 (FIG. 4). In most applications, the switching device 73 must be capable of switching potentials of about 1000 V or greater and at currents commensurate with the power of the system. In one preferred embodiment, the switching transistor 85 comprises an insulated gate bi-polar transistor (IGBT) of the type which are readily commercially available. However, as was mentioned above, a number of other types of semiconductor switching devices (e.g., FETs, etc.) or even non-semiconductor switching devices are available and could be substituted for the transistor arrangement set forth in FIG. 6 and described above, as would be obvious to persons having ordinary skill in the art.

The switch actuation circuit 78 may comprise any of a number of circuits well-known in the art for periodically actuating the switching device 73 to change it from a non-conducting state to a conducting state. In one preferred embodiment, the switch actuation circuit 78 would accomplish the actuation of switching device 73 by applying the appropriate base current to the transistor 85 to switch it from a non-conducting state to a conducting state at the desired time intervals. That is, the switch actuation circuit 78 should be designed to provide a switch actuation signal 70 to the switching device 73 at any of a range of frequencies suitable for providing an acceptable level of arc suppression for the particular plasma process being performed.

As was briefly described above, the duration of the reverse polarity cycle 80 (i.e., $t_2$–$t_1$) should be considerably shorter than the duration of the "normal" voltage cycle (i.e., $t_3$–$t_2$) in order to prevent, or at least substantially reduce, sputtering of the anode 12. Generally speaking, a ratio of about 5:1 is sufficient. That is, the duration of the "normal" voltage cycle should be at least 5 times longer than the duration of the reverse polarity cycle 80. Accordingly, in one preferred embodiment adapted for a reactive sputter deposition process, the switch actuation circuit activates (i.e., closes) the switching device 73 for about 2–5 $\mu s$ (i.e., the reverse polarity cycle time 80 shown in FIG. 5), with 3 us being preferred, at a frequency of about 50 kHz, although other cycle times 80 and frequencies could also be used without departing from the scope of this invention.

As was mentioned above, the power supply circuit 54 can be operated in the "passive arc suppression mode" if it does not include the optional arc detection circuit 79. When operating in the passive arc suppression mode, the switch actuation circuit 78 simply provides a switch actuation signal 89 to the switching device 73 for a time (i.e., reverse polarity cycle time 80) and at a periodic rate that may be appropriate for the particular plasma process being used.

The operation of the circuit 54 in the passive arc suppression mode is best understood by referring to FIGS. 4 and 5. For example, if the circuit 54 is to be used with a reactive sputter deposition process, a suitable power supply 68 is provided to maintain the voltage on the cathode/target 16 at a strong negative potential (e.g., –500 volts) with respect to the combined anode/ion source 12 during the time when the switching device 73 is in the non-conductive state (i.e., open). During this time, the reactive sputtering process (at least as far as the power supply circuit is concerned) is more or less operating in a steady state, with a substantially constant current I flowing through the first inductor 69 in the direction indicated by the arrow (i.e., the direction of positive current flow). The second capacitor 72 will have a net reverse charge (indicated by the "+" and "–" signs) across its plates with respect to the polarity of the electrodes 16 and 12. That is, the capacitor plate connected to the cathode/target 16 will have a voltage potential substantially equal to the voltage potential on the cathode/target 16 (e.g., –500 V), while the other capacitor plate, i.e., the plate connected to the second inductor 74, will have a slightly greater negative voltage (e.g., –600 V). The first capacitor 70 will essentially have the relative charge in the sense also indicated by the (+) and (–) signs shown in FIG. 4. At a certain time $t_1$ (FIG. 5), the switch actuation circuit 78 actuates the switching device 73 to change it from the non-conductive (i.e., open) state to the conductive (i.e., closed) state. When the switching device 73 closes, the second capacitor 72 is connected directly across the cathode/target 16 and combined anode/ion source 12, essentially instantly reversing the voltage potential on the electrodes. That is, the charge on the cathode/target 16 is now essentially 100 volts positive with respect to the charge on the combined anode/ion source 12. See FIG. 3. At this time, the second capacitor 72 begins to discharge through the power supply 68 and first inductor 69. The voltage on the second capacitor 72 plus the power supply voltage is impressed across the first inductor 69 causing the current I flowing through the first inductor 69 to increase in a substantially linear fashion in accordance with the well-known proportionality relation:

$$\frac{\Delta I}{\Delta t} \propto \frac{V}{L} \quad (1)$$

where:

V=the instantaneous voltage across the first inductor 69;

L=the inductance of the first inductor 69 at the loaded current; and $\Delta I/\Delta t$=the incremental time rate of change of the current I flowing through the inductor 69.

As was described above, the capacitance of the second capacitor 72 is selected so that it does not discharge by a significant amount before the switch actuation circuit 78 again actuates the switching device 73 causing it to return to the non-conductive (i.e., open) state at a time $t_2$. As soon as switching device 73 is opened, the increased current I flowing through the first inductor 69 causes the voltage on the cathode/target 16 to more or less instantly swing negative with respect to the combined anode/ion source 12. However, instead of stopping at the previous potential of about −500 V, the increased current I flowing through the first inductor 69 and the high impedance of the plasma 60 causes the voltage on the cathode/target 16 to continue to swing negative. The first capacitor 70 and the diode 71 form a voltage limiter or clamp and prevent the voltage from exceeding about −100 volts greater than the normal working voltage (e.g., about −600 volts in one preferred embodiment). Then, as the current I through the first inductor 69 decays to its original value and the plasma conduction is established, the voltage on the first electrode decreases until it again reaches about −500 V with respect to the combined anode/ion source 12.

The second inductor 74 prevents excessive current from flowing through the switching device 73 and first capacitor 70 during the conducting period of the switching cycle. That is, during the conducting period, the current flowing through the second inductor 74 increases, transferring energy from the first capacitor 70 to the second inductor 74. When the switching device 73 switches to the non-conducting state (e.g., at time $t_2$), the second inductor 74 drives current into the second capacitor 72, thus recharging the second capacitor 72 for the next cycle.

Figure 7:
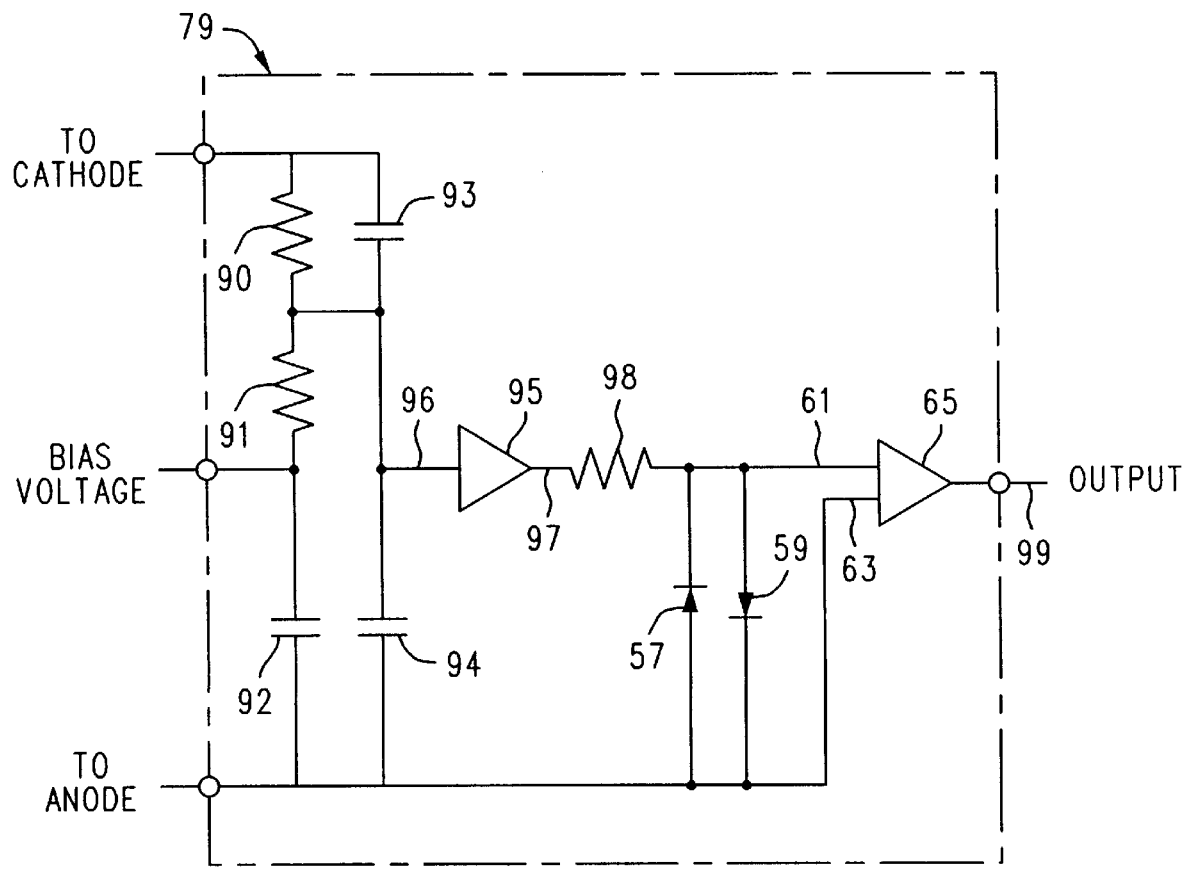
FIG. 7 is a schematic of an arc detection circuit.

In certain circumstances, it may be advantageous to enhance the arc suppression capabilities of the circuit 54 described above by connecting an arc detection circuit 79 to the switch actuation circuit 78. As was mentioned above, the arc detection circuit 79 works in concert with the normal operation of the switch actuation circuit 78 to reverse the voltage potential on the electrodes 16, 12 if an arc condition is detected during the time when the switching device 73 is in the non-conductive (i.e., open) state (e.g., during the time between $t_2$ and $t_3$). While many different kinds of arc detection devices are known and may be used with the present invention, one preferred embodiment of the present invention uses an arc detection circuit 79 substantially as shown in FIG. 7.

Essentially, arc detection circuit 79 may comprise first and second resistors 90 and 91 connected in series with a first capacitor 76 across the cathode/target 16 and the combined anode/ion source 12. See FIG. 4. A second capacitor 93 is connected in parallel with the first resistor 90. A third capacitor 94 is connected in series with the second capacitor 93 so that it is also connected in parallel with the series arrangement of resistor 91 and capacitor 92. The combination of resistors 90, 91 and capacitors 93 and 94 form a compensated voltage divider network which provides to the buffer amplifier 95 a reduced-voltage signal 96 that more accurately represents the actual voltage signal (i.e., waveform) on the cathode/target 16 and combined anode/ion source 12, than is possible with conventional, purely resistive voltage divider networks. A bias voltage is applied to resistor 91 to define the voltage level at which an arc is to be recognized. That is, an arc condition is assumed to exist and is recognized by the arc detection circuit 79 if the voltage potential between the electrodes starts to decrease and passes through a defined voltage level. The defined voltage level can be varied by adjusting the magnitude of the bias voltage applied to resistor 91.

The reduced voltage signal 96 from the compensated voltage divider network is then fed into buffer amplifier 95. The output signal 97 from buffer amplifier 95 is fed via resistor 98 to a diode clamp circuit comprising diodes 57 and 59. Under normal circumstances, the output signal 97 from buffer amplifier 95 will be negative. Hence, current will flow via resistor 98 and diode 57 and a negative clamped voltage of about 0.6 volts will appear across the input leads 61, 63 of comparator 65. Conversely, if the output signal 97 from amplifier 95 goes positive, diode 59 will conduct, again imposing a clamped voltage of about 0.6 volts across input leads 61 and 63 of amplifier 65. The arrangement of diodes 57 and 59, along with resistor 98, forms a non-linear voltage divider network or limiter which substantially reduces the input impedance presented to the inputs 61, 63 of comparator 65, thus removing a substantial amount of the RF (i.e., radio frequency) noise present in the output signal 97. The comparator 65 produces an output signal 99 when the voltage across its input leads 61, 63 passes through zero. The output signal 99 from comparator 65 may then be fed into the switch actuation circuit 78 to trigger the switching device 73. It should be noted that in this application it will be desirable to design the arc detection circuit 79 so that it will ignore the low voltage on the cathode/target 16 if the low voltage occurs during the normal reverse polarity cycle 80 of the switch actuation circuit 78, i.e., during normal pulsing.

As was described above, the provision of an arc detection circuit, such as circuit 79, will allow the circuit 54 to be operated in either the passive arc suppression mode described above or in an active arc suppression mode. The operation of the circuit 54 in the active arc suppression mode is essentially the same as the operation of the circuit in the passive mode, except that the switch actuation circuit 78 will actuate the switching device 73 upon the detection of an arc event by circuit 79 that may occur between the normal reverse polarity cycle times 80 (e.g., during the time between $t_2$ and $t_3$). See FIG. 5.

While the foregoing embodiment of the plasma processing system 10 has been shown and described as it could be used in conjunction with a planar magnetron (i.e., the cathode/target assembly 16) having a circular shape, as shown in FIG. 2, other types and configurations of the cathode/target assembly 16 could also be used. For example, referring to now to FIG. 8, another embodiment of a planar magnetron could comprise a rectangular cathode/target assembly 116. Such rectangular cathode/target assemblies may be particularly well-suited for coating relatively large objects or a large number of smaller objects.

The rectangular cathode/target assembly 116 may comprise a pair of end sections 111, 113 separated by an elongate straight section 115. Alternatively, the end sections 111, 113 need not be squared-off, and could instead comprise semi-circular end sections, in which case the target material 129 would have a generally oval configuration (not shown). Regardless of the particular configuration or shape of the rectangular or elongate cathode/target assembly 116 (i.e., whether the end sections 111, 113 are squared-off or semi-circular), the cathode/target assembly 116 may comprise a magnet assembly substantially similar to the magnet assembly for the circular planar magnetron shown in FIGS. 2 and 3. A similar magnet assembly is also shown and described in U.S. Pat. No. 5,262,028, referred to above and which is incorporated herein by reference for all that it discloses.

An elongate anode/ion source 112 may be incorporated into the center section of the elongate cathode/target assembly 112. The elongate combined anode/ion source assembly 112 is similar to the combined anode/ion source assembly 12 shown in FIGS. 2 and 3 and described above, except that it is elongated so that the respective end sections 141, 143 extend toward the end sections 111, 113 of the target material 129. The shield assembly 144 is similarly elongated and is configured so that the outer aperture 182 exposes the target material 129 to be sputtered. Shield assembly 144 also includes an inner or central aperture 146 that exposes the combined anode/ion source 112.

Figure 8:
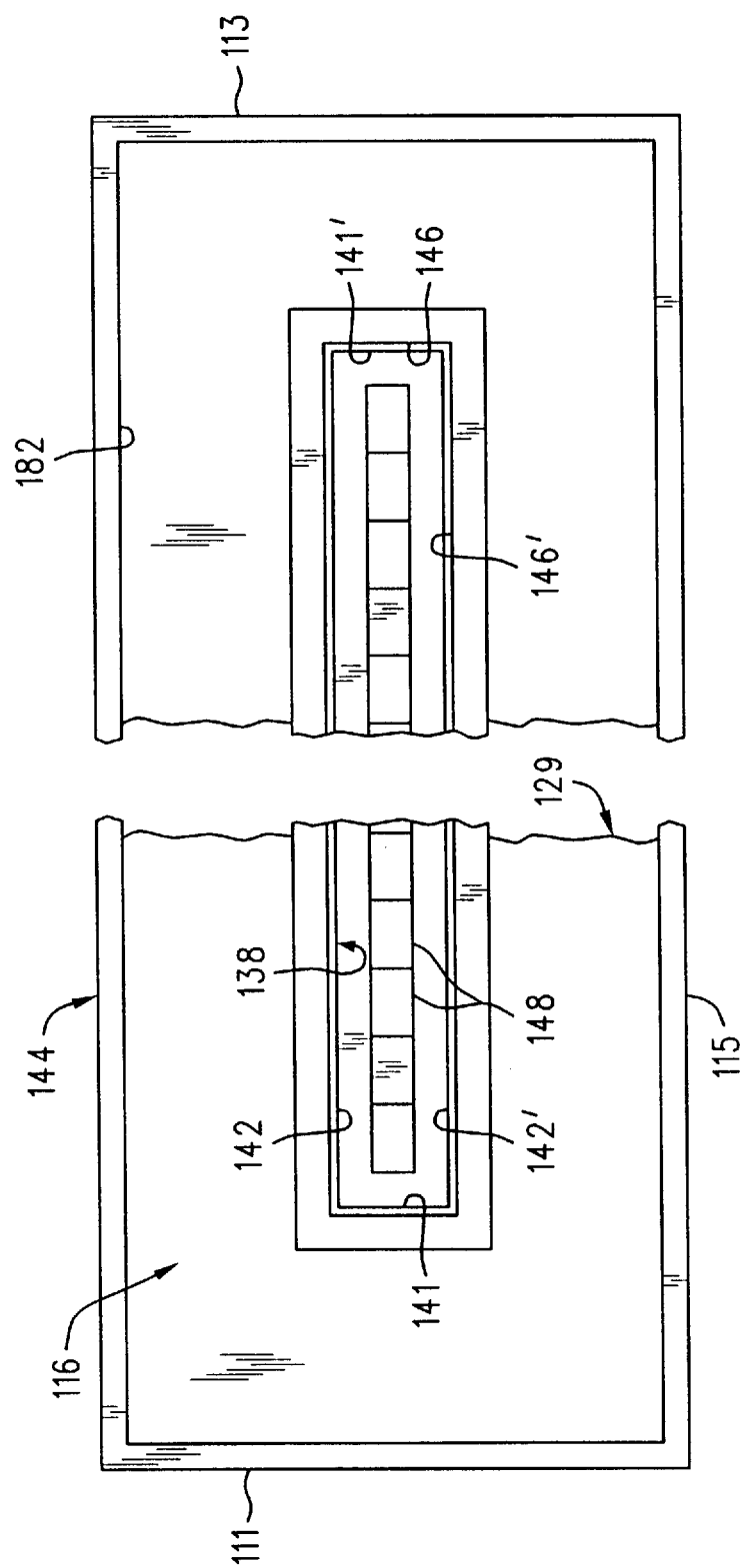
FIG. 8 is a plan view of a rectangular planar magnetron cathode/target assembly and combined anode/ion source assembly.

As was the case for the first embodiment of the anode/ion source 12, the elongate anode/ion source 112 shown in FIG. 8 includes an elongate electrode element 138 having an active surface 142 over which electrons (not shown in FIG. 8) become momentarily trapped, ionizing additional process gas and reactant gas atoms/molecules. In one embodiment, the electrode element 138 includes two elongate opposed side surfaces 142, 142' and two opposed end surface 141, 141'.

In one preferred embodiment, the various surfaces 142, 142' and 141, 141' are generally "vertically" (in the context of the various drawing Figures) oriented, i.e., similar to the vertically oriented active surface 42 shown in FIG. 3. However, the surfaces need not be vertically oriented, and could be inclined slightly from the vertical, similar to the tapered active surface 242 shown in FIG. 9. However, if the various active surfaces 141, 141', 142, and 142' are too "flat" i.e., either horizontal or slightly inclined to the horizontal, the electrons (not shown) trapped by the magnetic field positioned over the active surfaces will tend to impact the electrode element 138 at the end portions 141, 141' instead of making the turn and continuing down the opposite elongate side portion of the electrode element 138. If this happens, the number of ions created by the momentarily trapped electrons will decrease significantly.

Accordingly, it is preferred, but not required, that the various active surfaces 141, 141', 142, and 142' be oriented in the range of about 45–90 degrees from the horizontal (i.e., 90° being vertical). While the active surfaces e.g., 141, 141', 142, 142' can be oriented completely horizontally (i.e., at 0°), the ionization resulting from the active surfaces will be significantly reduced.

The magnetic field (not shown in FIG. 9) for trapping the electrons generally in a region over the active surface 142 of electrode element 138 may be produced by a plurality of permanent magnets. Specifically, the permanent magnets may comprise one or more center magnets 148 that extend between the end portions 141, 141' of the active surfaces. At any given cross section of the elongate anode/ion source 112, the magnetic field produced by the magnets 148 should be similar to the magnetic field B produced by the magnet 48 associated with the circular anode/ion source 12 shown in FIG. 3.

In yet another embodiment, the plasma processing system 210 may utilize a separate anode/ion source assembly 212. Referring now to FIG. 9, the plasma processing system 210 may comprise a vacuum or process chamber 214 for housing the separate anode/ion source assembly 212, a cathode/target assembly 216, and the object or substrate 218 to be coated. A supply of process gas 220 is connected to the interior 228 of process chamber 214 via a process gas valve assembly 222. The process gas valve assembly allows into the process chamber a quantity of a suitable process gas 221, such as argon. A supply of a reactant gas 230 is also connected to the interior 228 of process chamber 214 via a reactant gas valve assembly 232 and supplies a suitable quantity of reactant gas 234 into the interior 228 of process chamber 214. A vacuum pump 224 connected to the process chamber 214 via a vacuum valve assembly 226 maintains the interior 228 of the chamber 214 at a pressure suitable for carrying out the desired process.

The cathode/target assembly 216 may comprise any of a wide variety of cathode/target assemblies suitable for carrying out the desired process. In one preferred embodiment, the cathode/target assembly 216 comprises a circular planar magnetron, such as the circular planar magnetron cathode/target assembly 16 shown in FIGS. 1–3. Alternatively, the cathode/target assembly 216 may comprise an elongate or rectangular cathode/target assembly, such as the cathode/target assembly 116 shown in FIG. 8. Accordingly, the particular cathode/target assembly 216 used by the plasma processing system 210 will not be described in further detail.

The anode/ion source assembly 212 may be positioned within the interior 228 of the process chamber 214 at any suitable location and may comprise a generally cylindrically shaped electrode element 238 having an aperture 240 therein that defines a tapered interior surface 242 having a generally conical shape. It should be noted, however, that the interior surface 242 need not be conically shaped and may instead comprise a cylindrical surface similar to the surface 42 of the electrode element 38 shown in FIG. 3. The electrode element 238 is surrounded by a shield assembly 244 having a circular aperture 246 therein. The circular aperture 246 is generally aligned with the aperture 240 of electrode element 238 so that the conical interior surface 242 is exposed to the interior 228 of process chamber 214.

A permanent magnet 248 having a north pole (N) and a south pole (S) is mounted to the shield assembly 244 so that the magnetic field lines B produced by the magnet 248 generally arch over the conically shaped interior surface 242. The shield assembly 244 is also configured to receive a discharge nozzle 236 through which the reactant gas may be introduced, as indicated by arrow 234. Finally, a heat sink assembly 252 may be mounted adjacent the shield 244 and permanent magnet 248 to cool the magnet 248 and maintain it at a temperature below its Curie temperature. Heat sink assembly 252 may reject the heat collected from the magnet 248 via a suitable cooling system 250.

The electrode element 238 of the anode/ion source 212 is connected to the positive (+) terminal of a pulsed power supply 254 via a suitable electrical conductor 266. The cathode/target assembly 216 is connected to the negative (−)

terminal of the pulsed power supply 254 via another suitable electrical conductor 264. The shield assembly 244 of the anode/ion source 212 may be grounded, as may the process chamber 214. In one preferred embodiment, the power supply 254 may comprise a pulsed power supply substantially identical to the pulsed power supply 54 shown in FIG. 4 and described above.

This completes the description of the preferred embodiments of the present invention. It is contemplated that the inventive concepts herein described may be variously otherwise embodied and it is intended that the appended claims be construed to include alternative embodiments of the invention except insofar as limited by the prior art.

What is claimed is:

1. Plasma processing apparatus, comprising:
    a process chamber, said process chamber including a process gas supply for providing a process gas to said process chamber and a vacuum pump for maintaining the process chamber within a pressure range;
    a cathode/target assembly positioned within said process chamber, said cathode/target assembly being connected to a first terminal of an external power supply; and
    an anode/ion source assembly positioned within said process chamber, said anode/ion source assembly comprising,
        an electrode member having a central aperture therein, the central aperture defining an active surface on said electrode member, said electrode member also being adapted to be electrically connected to a second terminal of the external power supply;
        a magnet positioned adjacent said electrode member for generating an electron-confining magnetic tunnel adjacent the active surface of said electrode member, wherein the electron-confining magnetic tunnel traps electrons adjacent the active surface, some of the trapped electrons ionizing some of the process gas; and
        a shield having a central aperture therein, said shield surrounding said electrode member and electrically insulated therefrom, said shield also being mounted so that the central aperture in said shield is generally aligned with the central aperture in said electrode member.

2. The plasma processing apparatus of claim 1, wherein said external power supply comprises a pulsed power supply for periodically reversing a voltage potential between said cathode/target assembly and said anode/ion source assembly.

3. The plasma processing apparatus of claim 2 wherein said magnet comprises a permanent magnet and wherein said anode/ion source assembly includes a heat sink positioned adjacent said permanent magnet for maintaining said permanent magnet at a temperature below a Curie temperature associated with said permanent magnet.

4. The plasma processing apparatus of claim 3, further comprising a reactant gas supply connected to said process chamber for providing a reactant gas to said process chamber.

5. The plasma processing apparatus of claim 4, wherein said reactant gas supply includes a reactant gas discharge nozzle positioned adjacent the central aperture in said electrode member so that a portion of the reactant gas is directed through the central aperture in said electrode member, wherein some of the trapped electrons ionize some of the reactant gas.

6. The plasma processing apparatus of claim 1, wherein said cathode/target assembly comprises a planar magnetron assembly and wherein said anode/ion source assembly is positioned adjacent said planar magnetron assembly.

7. The plasma processing apparatus of claim 6, wherein said planar magnetron assembly includes a central aperture therein and wherein said anode/ion source assembly is positioned within the central aperture of said planar magnetron assembly.

8. The plasma processing apparatus of claim 1, wherein the active surface on said electrode member is conically shaped.

9. The plasma processing apparatus of claim 1, wherein the active surface on said electrode member is cylindrically shaped.

10. The plasma processing apparatus of claim 1, wherein the central aperture in said electrode member is substantially rectangular and wherein the active surface on said electrode member comprises at least two surfaces that are oriented in spaced-apart, generally opposed relation.

11. The plasma processing apparatus of claim 1, wherein said electrode member comprises carbon.

12. Plasma processing apparatus, comprising:
    a process chamber defining an interior;
    a process gas supply connected to said process chamber for providing a process gas to the interior of said process chamber;
    a reactant gas supply connected to said process chamber for providing a reactant gas to the interior of said process chamber;
    a vacuum pump connected to said process chamber for maintaining the interior of the process chamber within a pressure range;
    a cathode/target assembly positioned within said process chamber;
    an anode/ion source assembly positioned within said process chamber, said anode/ion source assembly comprising:
        a generally cylindrically shaped electrode member having a central aperture therein, said central aperture defining an active surface on said electrode member;
        a magnet positioned adjacent said electrode member for generating an electron-confining magnetic tunnel adjacent the active surface on said electrode member, wherein the electron-confining magnetic tunnel traps electrons adjacent the active surface, some of the trapped electrons ionizing the process gas and some of the trapped electrons ionizing the reactant gas; and
        a shield having a central aperture therein, said shield surrounding said electrode member and electrically insulated therefrom, said shield also being mounted so that the central aperture in said shield is generally aligned with the central aperture in said electrode member;
        a power supply having a positive terminal and a negative terminal, the positive terminal of said power supply being connected to;e electrode member of said anode/ion source assembly and the negative terminal of said power supply being connected to said cathode/target assembly, said power supply also including a polarity reversing circuit for periodically reversing a voltage potential between said cathode/target assembly and said anode/ion source assembly.

13. A cathode/target assembly, comprising:
    a generally plate shaped target material having a front surface and a back surface, the target material also having an aperture therein, said target material also being adapted to be connected to a first terminal of an external power supply;

a magnet assembly positioned adjacent the back surface of the target for producing a plasma-confining magnetic field adjacent the front surface of said target material;

an anode/ion source assembly positioned in the central aperture of said target material, said anode/ion source assembly comprising, an, electrode member having a central aperture therein, the central aperture defining an active surface on said electrode member, said electrode member also being adapted to be electrically connected to a second terminal of the external power supply;

a magnet positioned adjacent said electrode member for generating an electron-confining magnetic tunnel adjacent the active surface on said electrode member, wherein the electron-confining magnetic tunnel traps electrons adjacent the active surface; and a shield having a central aperture therein, said shield surrounding said electrode member and electrically insulated therefrom, said shield also being mounted so that the central aperture in said shield is generally aligned with the central aperture in said electrode member.

14. The cathode/target assembly of claim 13, wherein said electrode member is substantially cylindrically shaped and wherein the central aperture in said electrode member is substantially circular so that the active surface is substantially cylindrical.

15. The cathode/target assembly of claim 14, wherein said magnet comprises a permanent magnet and wherein said anode/ion source assembly includes a heat sink for maintaining said permanent magnet at a temperature below a Curie temperature associated with said permanent magnet.

16. The cathode/target assembly of claim 15, wherein said electrode member comprises carbon.

17. The cathode/target assembly of claim 16, wherein said shield is electrically connected to a ground.

18. The cathode/target assembly of claim 17, wherein said anode/ion source assembly includes a reactant gas discharge nozzle positioned adjacent said electrode member and generally aligned with the central aperture in said electrode member so that a portion of a reactant gas discharged from said reactant gas discharge nozzle enters the central aperture of said electrode member, wherein some of the trapped electrons ionize some of the reactant gas.

19. The cathode/target assembly of claim 18, wherein said target material comprises a substantially flat, substantially circular member and wherein said magnet assembly comprises a plurality of permanent magnets for producing the plasma-confining magnetic field over the front surface of said target material.

20. The cathode/target assembly of claim 18, wherein said target material comprises a substantially flat, generally rectangular member and wherein said magnet assembly comprises a plurality of permanent magnets for producing the plasma-confining magnetic field over the front surface of said target material.

21. A cathode/target assembly, comprising:

a generally plate shaped target material having a front surface and a back surface and having a central aperture therein, said target material also being adapted to be connected to a first terminal of an external power supply;

a magnet assembly positioned adjacent the back surface of the target for producing a plasma-confining magnetic field adjacent the front surface of said target material;

an anode/ion source assembly positioned in the central aperture of said target material, said anode/ion source assembly comprising, an electrode member having a central aperture therein, the central aperture defining an active surface therein, said electrode member also being adapted to be electrically connected to a second terminal of the external power supply, said electrode member comprising carbon;

a permanent magnet positioned adjacent said electrode member for generating an electron-confining magnetic tunnel adjacent the active surface on said electrode member, wherein the electron-confining magnetic tunnel traps electrons adjacent the active surface; and a shield having a central aperture therein, said shield surrounding said electrode member and electrically insulated therefrom, said shield also being mounted so that the central aperture in said shield is generally aligned with the central aperture in said electrode member, said shield being adapted to be electrically connected to a ground;

a heat sink mounted adjacent said permanent magnet for maintaining said permanent magnet at a temperature below a Curie temperature associated with said permanent magnet;

a reactant gas discharge nozzle positioned adjacent said electrode member and generally aligned with the central aperture in said electrode member so that a portion of a reactant gas discharged from said reactant gas discharge nozzle enters the central aperture of said electrode member, wherein some of the trapped electrons adjacent the active surface ionize some of the reactant gas.

22. A method for performing reactive sputtering, comprising the steps of:

applying a voltage potential to a cathode/target assembly positioned within a process chamber, the process chamber defining an interior, the process chamber including a process gas supply for providing a process gas to the interior of the chamber, a reactant gas supply for providing a reactant gas to the interior of the chamber, and a vacuum pump for maintaining the interior of the process chamber within a pressure range;

applying a voltage potential to an anode/ion source assembly, the voltage potential on the anode/ion source assembly being positive with respect to the voltage potential on the cathode/target assembly, the anode/ion source assembly comprising an electrode member having a central aperture therein that defines an active surface on said electrode member, a magnet positioned adjacent the electrode member for producing an electron-confining tunnel adjacent the active surface of the electrode member; wherein the voltage potential between the cathode/target assembly and said anode/ion source assembly results in the creation of a plasma generally adjacent the cathode/target assembly, and wherein electrons migrating toward the anode/ion source assembly are trapped by the electron-confining magnetic tunnel, some of the trapped electrons ionizing some of the reactant gas; and periodically reversing the voltage potential between the cathode/target assembly and the anode/ion source assembly so that said anode/ion source assembly has impressed upon it a voltage potential that is negative with respect to a voltage potential on the cathode/target assembly.

* * * * *

UNITED STATES PATENT AND TRADEMARK OFFICE
CERTIFICATE OF CORRECTION

PATENT NO. : 5,855,745
DATED : January 5, 1999
INVENTOR(S) : Barry W. Manley

It is certified that error appears in the above-identified patent and that said Letters Patent is hereby corrected as shown below:

In column 2, line 25, after "could" insert --be--.

In column 7, line 60, after "time $t_1$" delete --,--.

In column 11, line 18, change "304" to --304--.

In column 11, line 62, change "304" to --304--.

In column 13, line 23, change "i-e.," to --i.e.,--.

In column 14, line 30, change "3 us" to --3 µs--.

IN THE CLAIMS:

In column 20, line 55, change "to;e" to --to the--.

In column 21, line 7, change "an, electrode" to --an electrode--.

Signed and Sealed this

Twentieth Day of July, 1999

Attest:

Q. TODD DICKINSON

*Attesting Officer*

*Acting Commissioner of Patents and Trademarks*